(12) United States Patent
Imamura (10) Patent No.: US 9,083,306 B2
(45) Date of Patent: Jul. 14, 2015

(54) BAND-PASS FILTER

(75) Inventor: Mitsutoshi Imamura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 250 days.

(21) Appl. No.: 13/613,015

(22) Filed: Sep. 13, 2012

(65) Prior Publication Data
US 2013/0076454 A1 Mar. 28, 2013

(30) Foreign Application Priority Data

Sep. 23, 2011 (JP) ................................. 2011-208243

(51) Int. Cl.
*H03H 7/01* (2006.01)
*H03H 7/09* (2006.01)
*H03H 1/00* (2006.01)

(52) U.S. Cl.
CPC .............. *H03H 7/1708* (2013.01); *H03H 7/09* (2013.01); *H03H 7/1766* (2013.01); *H03H 7/1775* (2013.01); *H03H 2001/0085* (2013.01)

(58) Field of Classification Search
CPC ............ H03H 2001/0085; H03H 7/09; H03H 7/1775; H03H 7/1708
USPC .......................................... 333/175, 176, 185
See application file for complete search history.

(56) References Cited

U.S. PATENT DOCUMENTS

| | | | |
|---|---|---|---|
| 6,759,926 B2 * | 7/2004 | Yamaguchi | .................... 333/175 |
| 7,671,706 B2 * | 3/2010 | Taniguchi | ..................... 333/203 |
| 2002/0030561 A1 | 3/2002 | Masuda et al. | |

FOREIGN PATENT DOCUMENTS

| | | |
|---|---|---|
| EP | 2 009 787 A1 | 12/2008 |
| JP | 60-152515 A | 8/1985 |
| JP | 62-61530 U | 4/1987 |
| JP | 10-190304 A | 7/1998 |
| JP | 2002-94349 A | 3/2002 |
| WO | 2007/119356 A1 | 10/2007 |

OTHER PUBLICATIONS

Official Communication issued in corresponding Japanese Patent Application No. 2013-218803, mailed on Jul. 15, 2014.
Official Communication issued in corresponding Taiwanese Patent Application No. 101129678, mailed on Dec. 16, 2014.

* cited by examiner

*Primary Examiner* — Benny Lee
*Assistant Examiner* — Rakesh Patel
(74) *Attorney, Agent, or Firm* — Keating & Bennett, LLP (57) ABSTRACT

A band-pass filter that significantly reduces and prevents impedance mismatch without requiring special elements includes an input terminal, an output terminal, three LC parallel resonators arranged between the input terminal and the output terminal, and two trap resonators arranged between the three LC parallel resonators and the input terminal and the output terminal, respectively. Each of the two trap resonators is electromagnetically coupled to a respective one of the three LC parallel resonators.

15 Claims, 6 Drawing Sheets

BAND-PASS FILTER

BACKGROUND OF THE INVENTION

1. Field of the Invention

The present invention relates to a band-pass filter, and more particularly to a band-pass filter including LC parallel resonators and trap resonators.

2. Description of the Related Art

A band-pass filter including LC parallel resonators and trap resonators, such as that described in Japanese Unexamined Patent Application Publication No. 2002-94349, has been known.

Figure 6:
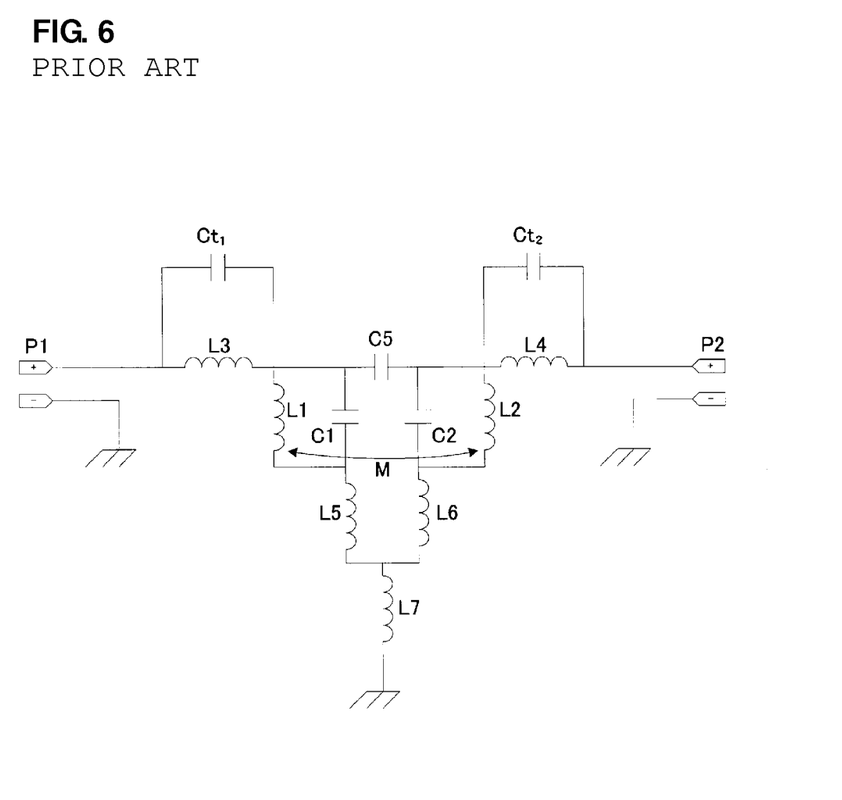
FIG. 6 is an equivalent circuit diagram of a band-pass filter of the related art.

In the band-pass filter, as illustrated in FIG. 6, an LC parallel resonator including an inductor L1 and a capacitor C1, which are connected in parallel, and an LC parallel resonator including an inductor L2 and a capacitor C2, which are connected in parallel, are connected between an input terminal P1 and an output terminal P2. In addition, a trap resonator including an inductor L3 and a capacitor $Ct_1$, which are connected in parallel, is connected in series between the input terminal P1 and the LC parallel resonator including the inductor L1 and the capacitor C1, which are connected in parallel. Further, a trap resonator including an inductor L4 and a capacitor $Ct_2$, which are connected in parallel, is connected in series between the output terminal P2 and the LC parallel resonator including the inductor L2 and the capacitor C2, which are connected in parallel. These trap resonators are provided to secure a sufficient attenuation amount necessary for desired frequencies outside the passband.

When the trap resonators are connected in series between the input and output terminals and the LC parallel resonators, as illustrated in FIG. 6, impedance mismatch occurs between the input and output terminals and the LC parallel resonators. Therefore, it is necessary to overcome this mismatch when the band-pass filter described in Japanese Unexamined Patent Application Publication No. 2002-94349 is connected to an external circuit. To this end, adjusting elements, such as capacitors and/or inductors, for overcoming the impedance mismatch are necessary to be additionally provided between the LC parallel resonators and the trap resonators.

SUMMARY OF THE INVENTION

Accordingly, preferred embodiments of the present invention provide a band-pass filter that overcomes impedance mismatch without requiring special elements.

According to a preferred embodiment of the present invention, a band-pass filter includes an input terminal; an output terminal; an LC parallel resonator arranged between the input terminal and the output terminal, the LC parallel resonator including one end that is grounded; and a trap resonator arranged between the LC parallel resonator and at least one of the input terminal and the output terminal, the trap resonator being arranged so as to be electromagnetically coupled to the LC parallel resonator.

It is preferable that the band-pass filter further includes a plurality of dielectric layers; and a plurality of electrode layers located on the dielectric layers, the dielectric layers and the electrode layers being stacked on one another. Preferably, an inductor of the LC parallel resonator and an inductor of the trap resonator each include a via electrode penetrating through the dielectric layers and a line electrode layer located on one of the dielectric layers. Preferably, the LC parallel resonator and the trap resonator are electromagnetically coupled to each other.

It is preferable that a capacitor of the LC parallel resonator include a capacitor electrode layer and a ground electrode layer that face each other. It is preferable that the inductor of the LC parallel resonator have a substantially loop shaped configuration including a line electrode layer, a via electrode that establishes electrical connection between one of two ends of the line electrode layer and the capacitor electrode layer, and a via electrode that establishes electrical connection between the other end of the line electrode layer and the ground electrode layer. Preferably, a capacitor of the trap resonator includes a pair of capacitor electrode layers that face each other. Preferably, the inductor of the trap resonator has a substantially loop shaped configuration including a line electrode layer, a via electrode that establishes electrical connection between one of two ends of the line electrode layer and one of the two capacitor electrode layers, and a via electrode that establishes electrical connection between the other end of the line electrode layer and the other capacitor electrode layer.

It is preferable that the substantially loop shaped configuration of the inductor of the LC parallel resonator and the substantially loop shaped configuration of the inductor of the trap resonator at least partially overlap, when viewed in a direction perpendicular or substantially perpendicular to a surface including the two via electrodes of the inductor of the LC parallel resonator or the trap resonator.

It is preferable that the LC parallel resonator include a plurality of LC parallel resonators. Preferably, a height, in a stacking direction, of the substantially loop shaped configuration of the inductor of the LC parallel resonator, among the plurality of LC parallel resonators, which is closest to the trap resonator, is the same or substantially the same as a height, in the stacking direction, of the substantially loop shaped configuration of the inductor of the trap resonator.

It is preferable that the LC parallel resonator include a plurality of LC parallel resonators. Preferably, the capacitor electrode layer of the LC parallel resonator, among the plurality of LC parallel resonators, which is closest to the trap resonator, and the capacitor electrode layer of the trap resonator face a coupling electrode layer located on one of the dielectric layers, across the dielectric layer, and the LC parallel resonator and the trap resonator are electromagnetically coupled to each other via the coupling electrode layer.

It is preferable that the band-pass filter further include an adjusting electrode layer located on one of the dielectric layers and connected to the ground electrode layer. Preferably, with respect to the line electrode layer of the LC parallel resonator, the adjusting electrode layer is located on an opposite side, in a stacking direction, to the ground electrode layer and the capacitor electrode layer, and is arranged to overlap the line electrode layer when viewed in the stacking direction.

According to the band-pass filter according to various preferred embodiments of the present invention, impedance mismatch may be reduced since the trap resonator and the LC parallel resonator are electromagnetically coupled to each other.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described.

First Preferred Embodiment

Figure 1:
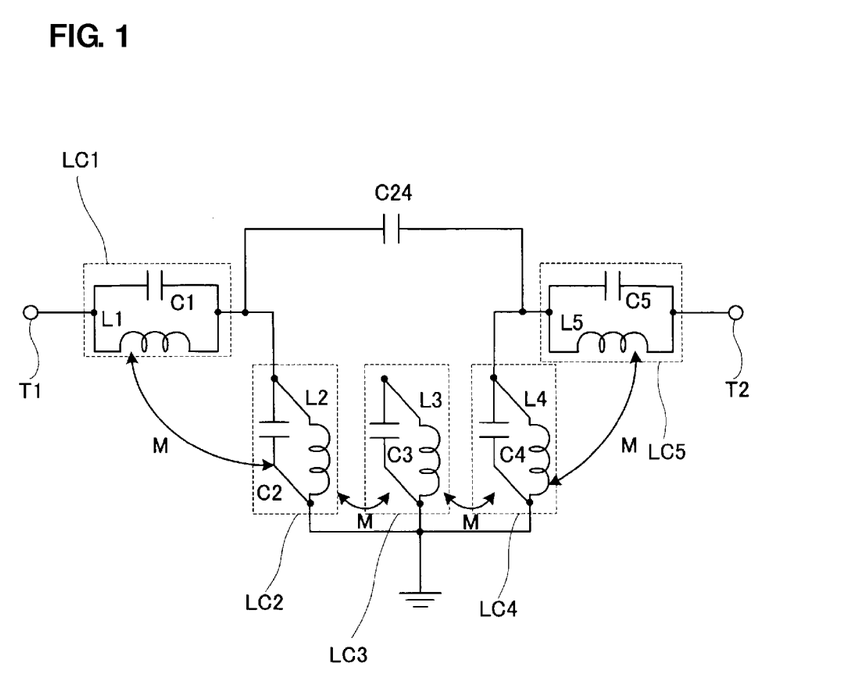
FIG. 1 is an equivalent circuit diagram of a band-pass filter according to a preferred embodiment of the present invention.

FIG. 1 is an equivalent circuit diagram of a band-pass filter according to a first preferred embodiment. In the first preferred embodiment, a terminal T1 is an input terminal, and a terminal T2 is an output terminal. Three LC parallel resonators LC2, LC3, and LC4 and two trap resonators LC1 and LC5 are arranged between the terminals T1 and T2. One of two ends of each of the LC parallel resonators LC2, LC3, and LC4 is grounded. The LC parallel resonators LC2 and LC3, and the LC parallel resonators LC3 and LC4 are electromagnetically coupled to each other. The LC parallel resonators LC2, LC3, and LC4 have a function of passing signals in a specific frequency band and stopping or filtering signals in the other frequency bands.

The trap resonator LC1 is connected in series between the terminal T1 and the LC parallel resonator LC2. The trap resonator LC5 is connected in series between the terminal T2 and the LC parallel resonator LC4. The trap resonators LC1 and LC5 are provided to secure a sufficient attenuation amount necessary for desired frequency bands outside the passband.

Figure 2:
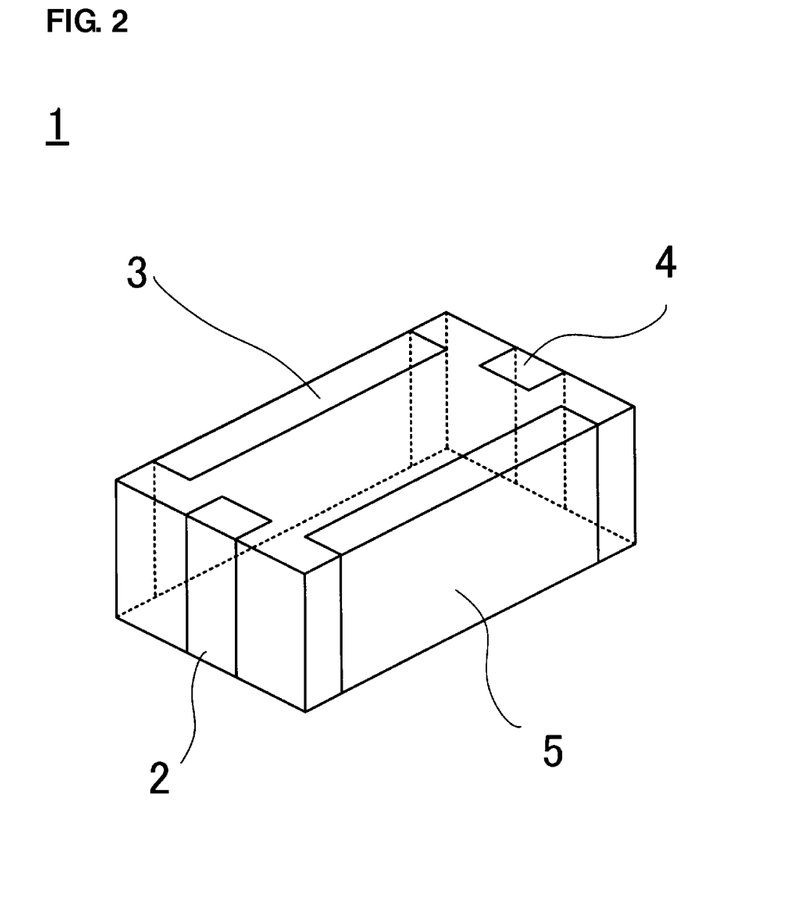
FIG. 2 is a perspective view of the band-pass filter according to a preferred embodiment of the present invention.

FIG. 2 is a perspective view of the band-pass filter according to the first preferred embodiment. A band-pass filter 1 of the first preferred embodiment is a substantially rectangular parallelepiped that includes two main surfaces which may face a mounting surface, and four lateral surfaces. On the four lateral surfaces of the band-pass filter 1, an input terminal 2, an output terminal 4, and ground terminals 3 and 5 are provided, respectively.

Figure 3:
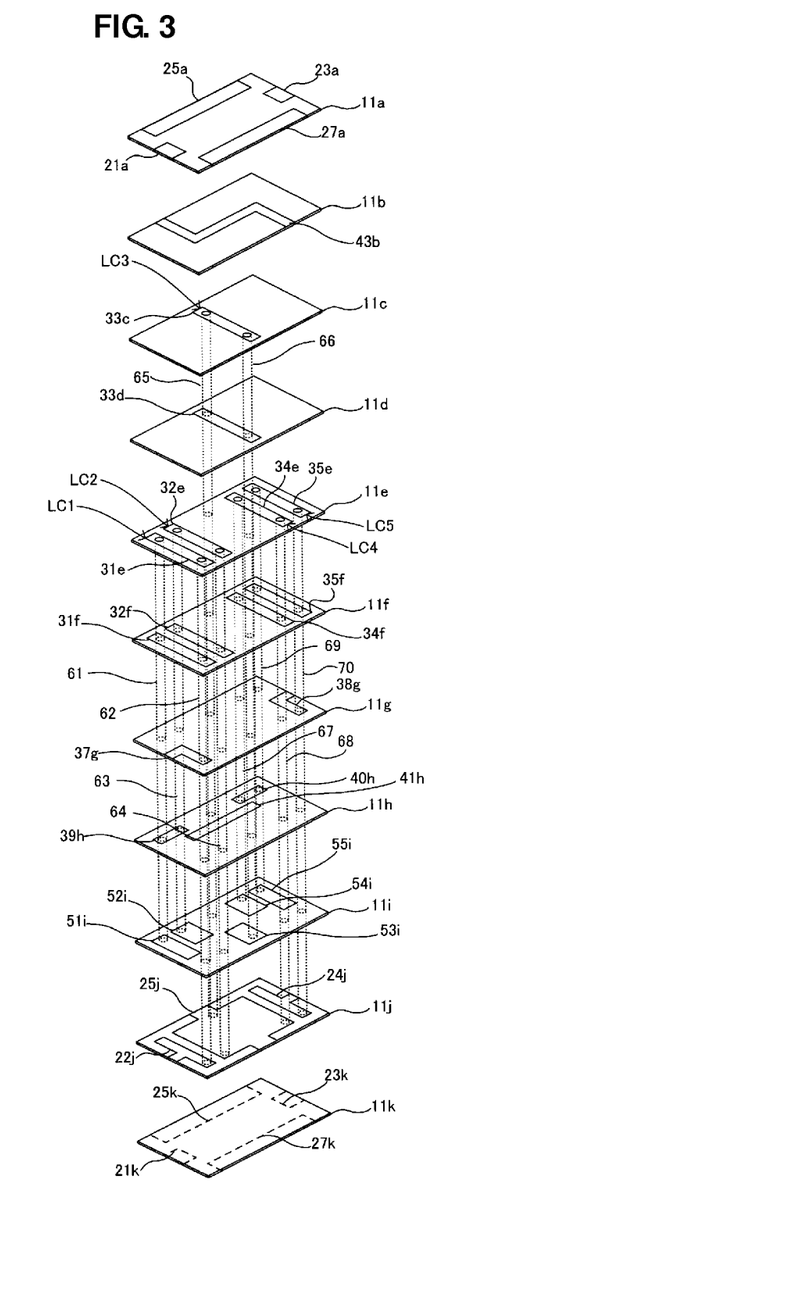
FIG. 3 is an exploded perspective view of the band-pass filter according to a preferred embodiment of the present invention.

FIG. 3 is an exploded perspective view of the band-pass filter according to the first preferred embodiment. The band-pass filter includes plural dielectric layers 11a to 11k, plural electrode layers located on the dielectric layers 11a to 11k, and via electrodes 61, 62, 63, 64, 65, 66, 67, 68, 69, and 70 penetrating through the dielectric layers 11c to 11i in a direction in which the layers are stacked on one another.

An input electrode layer 21a, an output electrode layer 23a, and ground electrode layers 25a and 27a are located on the dielectric layer 11a. An adjusting electrode layer 43b is located on the dielectric layer 11b. Line electrode layers 33c and 33d are located on the dielectric layers 11c and 11d, respectively. Line electrode layers 31e, 32e, 34e, and 35e are located on the dielectric layer 11e. Line electrode layers 31f, 32f, 34f, and 35f are located on the dielectric layer 11f. Lead electrode layers 37g and 38g are located on the dielectric layer 11g. Connecting electrode layers 39h and 40h, and a coupling electrode layer 41h are located on the dielectric layer 11h. Capacitor electrode layers 51i, 52i, 53i, 54i, and 55i are located on the dielectric layer 11i. Lead electrode layers 22j and 24j, and a ground electrode layer 25j are located on the dielectric layer 11j. An input electrode layer 21k, an output electrode layer 23k, and ground electrode layers 25k and 27k are located on the dielectric layer 11k. The input electrode layer 21k, the output electrode layer 23k, and the ground electrode layers 25k and 27k are arranged so as to be exposed at a surface of a multilayer body after the layers are stacked on one another. The via electrodes 61, 62, 63, 64, 65, 66, 67, 68, 69, and 70 are arranged along the stacking direction of the multilayer body so as to penetrate through the dielectric layers 11.

A capacitor C1 (see FIG. 1) of the trap resonator LC1 is configured such that the capacitor electrode layer 51i and the lead electrode layer 22j face each other across the dielectric layer 11i. The lead electrode layer 22j defines a capacitor electrode layer.

An inductor L1 (see FIG. 1) of the trap resonator LC1 includes the line electrode layers 31e and 31f and the via electrodes 61 and 62. The via electrode 61 establishes electrical connection between one of two ends of each of the line electrode layers 31e and 31f and the capacitor electrode layer 51i. The via electrode 62 establishes electrical connection between the other end of each of the line electrode layers 31e and 31f and the lead electrode layer 22j. In this manner, the inductor L1 is preferably arranged to have a substantially loop shaped configuration that starts at the node between the capacitor electrode layer 51i and the via electrode 61, goes through the line electrode layers 31e and 31f, and ends at the node between the lead electrode layer 22j and the via electrode 62.

The line electrode layers 31e and 31f are connected in parallel to the via electrodes 61 and 62. Accordingly, the resistance of the overall inductor L1 is reduced, and the Q characteristics of the trap resonator LC1 are improved.

The lead electrode layer 37g is connected to the via electrodes 62. The lead electrode layer 37g is led out to a lateral surface of the multilayer body and is connected to the input electrode layers 21a and 21k and the lead electrode layer 22j.

A capacitor C2 (see FIG. 1) of the LC parallel resonator LC2 is configured such that the capacitor electrode layer 52i and the ground electrode layer 25j face each other across the dielectric layer 11i.

An inductor L2 (see FIG. 1) of the trap resonator LC2 includes the line electrode layers 32e and 32f and the via electrodes 63 and 64. The via electrode 63 establishes electrical connection between one of two ends of each of the line electrode layers 32e and 32f and the capacitor electrode layer 52i. The via electrode 64 establishes electrical connection between the other end of each of the line electrode layers 32e and 32f and the ground electrode layer 25j. In this manner, the inductor L2 is preferably arranged in a substantially loop shaped configuration that starts at the node between the capacitor electrode layer 52i and the via electrode 63, goes through the line electrode layers 32e and 32f, and ends at the node between the ground electrode layer 25j and the via electrode 64.

The connecting electrode layer 39h establishes electrical connection between the via electrode 61 of the trap resonator LC1 and the via electrode 63 of the LC parallel resonator LC2.

A capacitor C3 (see FIG. 1) of the LC parallel resonator LC3 is configured such that the capacitor electrode layer 53i and the ground electrode layer 25j face each other across the dielectric layer 11i.

An inductor L3 (see FIG. 1) of the LC parallel resonator LC3 includes the line electrode layers 33c and 33d and the via electrodes 65 and 66. The via electrode 65 establishes electrical connection between one of two ends of each of the line electrode layers 33c and 33d and the ground electrode layer 25j. The via electrode 66 establishes electrical connection between the other end of each of the line electrode layers 33c and 33d and the capacitor electrode layer 53i. In this manner, the inductor L3 is preferably arranged in a substantially loop shaped configuration that starts at the node between the ground electrode layer 25j and the via electrode 65, goes through the line electrode layers 33c and 33d, and ends at the node between the capacitor electrode layer 53i and the via electrode 66.

A capacitor C4 (see FIG. 1) of the LC parallel resonator LC4 is configured such that the capacitor electrode layer 54i and the ground electrode layer 25j face each other across the dielectric layer 11i.

An inductor L4 (see FIG. 1) of the LC parallel resonator LC4 includes the line electrode layers 34e and 34f and the via electrodes 67 and 68. The via electrode 67 establishes electrical connection between one of two ends of each of the line electrode layers 34e and 34f and the capacitor electrode layer 54i. The via electrode 68 establishes electrical connection between the other end of each of the line electrode layers 34e and 34f and the ground electrode layer 25j. In this manner, the inductor L4 is preferably arranged in a substantially loop shaped configuration that starts at the node between the capacitor electrode layer 54i and the via electrode 67, goes through the line electrode layers 34e and 34f, and ends at the node between the ground electrode layer 25j and the via electrode 68.

A capacitor C5 (see FIG. 1) of the trap resonator LC5 is configured such that the capacitor electrode layer 55i and the lead electrode layer 24j face each other across the dielectric layer 11i.

An inductor L5 (see FIG. 1) of the trap resonator LC5 includes the line electrode layers 35e and 35f and the via electrodes 69 and 70. The via electrode 69 establishes electrical connection between one of two ends of each of the line electrode layers 35e and 35f and the capacitor electrode layer 55i. The via electrode 70 establishes electrical connection between the other end of each of the line electrode layers 35e and 35f and the lead electrode layer 24j. In this manner, the inductor L5 is preferably arranged in a substantially loop shaped configuration that starts at the node between the capacitor electrode layer 55i and the via electrode 69, goes through the line electrode layers 35e and 35f, and ends at the node between the lead electrode layer 24j and the via electrode 70.

The lead electrode layer 38g is connected to the via electrode 70. The lead electrode layer 38g is connected, on a lateral surface of the multilayer body, to the output electrode layers 23a and 23k and the lead electrode layer 24j.

The connecting electrode layer 40h establishes electrical connection between the via electrode 67 included in the inductor L4 of the LC parallel resonator LC4 and the via electrode 69 included in the inductor L5 of the trap resonator LC5.

The coupling electrode layer 41h constitutes a coupling capacitor C24 (see FIG. 1) facing the capacitor electrode layer 52i included in the capacitor C2 of the LC parallel resonator LC2 and the capacitor electrode layer 54i included in the capacitor C4 of the LC parallel resonator LC4, across the dielectric layer 11h. The LC parallel resonators LC2 and LC4 are coupled to each other via the coupling capacitor C24.

In the first preferred embodiment, the trap resonator LC1 and the LC parallel resonator LC2 are electromagnetically coupled to each other. Also, the LC parallel resonator LC4 and the trap resonator LC5 are electromagnetically coupled to each other. This unique arrangement reduces impedance mismatch that occurs between the trap resonators LC1 and LC5 and the LC parallel resonators LC2 and LC4 when the trap resonators LC1 and LC5 are provided.

More specifically, the substantially loop shaped configuration of the inductor L1 of the trap resonator LC1 and the substantially loop shaped configuration of the inductor L2 of the LC parallel resonator LC2 at least partially overlap, when viewed in a direction perpendicular or substantially perpendicular to a surface including the two via electrodes 61 and 62 of the inductor L1 of the trap resonator LC1. Accordingly, the trap resonator LC1 and the LC parallel resonator LC2 are coupled to each other. Similarly, the substantially loop shaped configuration of the inductor L4 of the LC parallel resonator LC4 and the substantially loop shaped configuration of the inductor L5 of the trap resonator LC5 at least partially overlap. Accordingly, the LC parallel resonator LC4 and the trap resonator LC5 are coupled to each other.

According to the first preferred embodiment, in the multilayer body, the height, in the stacking direction, of the substantially loop shaped configuration of the LC parallel resonator LC2 closest to the trap resonator LC1 is the same or substantially the same as the height, in the stacking direction, of the substantially loop shaped configuration of the trap resonator LC1. Here, the height, in the stacking direction, of the substantially loop shaped configuration means the length of the longest via electrode among via electrodes included in the substantially loop shaped configuration. Therefore, the height, in the stacking direction, of the substantially loop shaped configuration of the trap resonator LC1 is the length of the via electrode 62. Also, the length, in the stacking direction, of the substantially loop shaped configuration of the LC parallel resonator LC2 is the length of the via electrode 64. At this time, the line electrode layers 31e and 32e are preferably located on the same dielectric layer 11e, and the line electrode layers 31f and 32f are preferably located on the same dielectric layer 11f.

Similarly, according to the first preferred embodiment, the height, in the stacking direction, of the substantially loop shaped configuration of the LC parallel resonator LC4 is the same as the height, in the stacking direction, of the substantially loop shaped configuration of the trap resonator LC5.

The inductors L1 and L5 of the trap resonators LC1 and LC5, and the inductors L2 and L4 of the LC parallel resonators LC2 and LC4 closest to the trap resonators LC1 and LC5 may have different heights in the stacking direction. The degree of coupling is adjustable by adjusting the heights, in the stacking direction, of the inductors L1 and L5 and the inductors L2 and L4.

A signal input from the lead electrode layer 22j passes through the via electrode 62, the line electrode layers 31e and 31f, and the via electrode 61 in this order in the trap resonator LC1. That is, the signal flows in the counterclockwise direction, when viewed from a lateral surface on the input terminal side (see FIG. 2).

In the LC parallel resonator LC2, a signal that has passed through the connecting electrode layer 39h flows through the via electrode 63, the line electrode layers 32e and 32f, and the via electrode 64 in this order. That is, the signal flows in the clockwise direction, when viewed from the lateral face on the input terminal side.

The LC parallel resonator LC3 is electromagnetically coupled to the LC parallel resonator LC2, and a signal flows towards the ground electrode layer 25*j*. Thus, a signal flows through the via electrode 66, the line electrode layers 33*c* and 33*d*, and the via electrode 65 in this order in the LC parallel resonator LC3. That is, the signal flows in the counterclockwise direction, when viewed from the lateral surface on the input terminal side.

The LC parallel resonator LC4 is electromagnetically coupled to the LC parallel resonator LC3, and a signal flows towards the ground electrode layer 25. Thus, a signal flows through the via electrode 67, the line electrode layers 34*e* and 34*f*, and the via electrode 68 in this order in the LC parallel resonator LC4. That is, the signal flows in the clockwise direction, when viewed from the lateral surface on the input terminal side.

In the trap resonator LC5, a signal that has passed through the connecting electrode layer 40*h* flows through the via electrode 70, the line electrode layers 35*e* and 35*f*, and the via electrode 69 in this order. The signal flows in a direction opposite to the LC parallel resonator LC4, that is, in the counterclockwise direction, when viewed from the lateral surface on the input terminal side.

As has been described above, according to the first preferred embodiment, signals flow in the opposite directions in the trap resonator LC1 and the LC parallel resonator LC2. Thus, the trap resonator LC1 and the LC parallel resonator LC2 have a strong capacitive coupling with each other. Similarly, the LC parallel resonator LC4 and the trap resonator LC5 also have a strong capacitive coupling with each other.

In contrast, the connecting electrode layer 39*h* may be arranged so that, for example, signals flow in the same directions in the trap resonator LC1 and the LC parallel resonator LC2. In this case, the trap resonator LC1 and the LC parallel resonator LC2 have a strong dielectric coupling with each other.

When the LC parallel resonators LC2, LC3, and LC4 are designed at an impedance of about 50Ω, if the impedance of the trap resonators LC1 and LC5 is greater than about 50Ω, the coupling between the LC parallel resonators LC2 and LC4 and the trap resonators LC1 and LC5 is capacitive coupling, which reduces the impedance and eventually may overcome the impedance mismatch. In contrast, when the impedance of the trap resonators LC1 and LC5 is less than about 50Ω, the coupling between the LC parallel resonators LC2 and LC4 and the trap resonators LC1 and LC5 is dielectric coupling, which increases the impedance.

According to the first preferred embodiment, the adjusting electrode layer 43*b* is preferably provided on the dielectric layer 11*b*. The adjusting electrode layer 43*b* is connected, on lateral surfaces of the multilayer body, to the ground electrode layers 25*a*, 27*a*, 25*j*, 25*k*, and 27*k*. With respect to the line electrode layers 33*c* and 33*d* of the LC parallel resonator LC3, the adjusting electrode layer 43*b* is arranged on the opposite side, in the stacking direction, to the ground electrode layer 25*j* and the capacitor electrode layer 53*i*. That is, the adjusting electrode layer 43*b* is preferably located outside the substantially loop shaped configuration including the line electrode layers 33*c* and 33*d* and the via electrodes 65 and 66. When viewed in the stacking direction, the adjusting electrode layer 43*b* is arranged so as to overlap the line electrode layers 32*e*, 32*f*, 33*c*, 33*d*, 34*e*, and 34*f*. The adjusting electrode layer 43*b* is provided to adjust the bandwidth of the passband frequency of the band-pass filter.

Figure 4A:
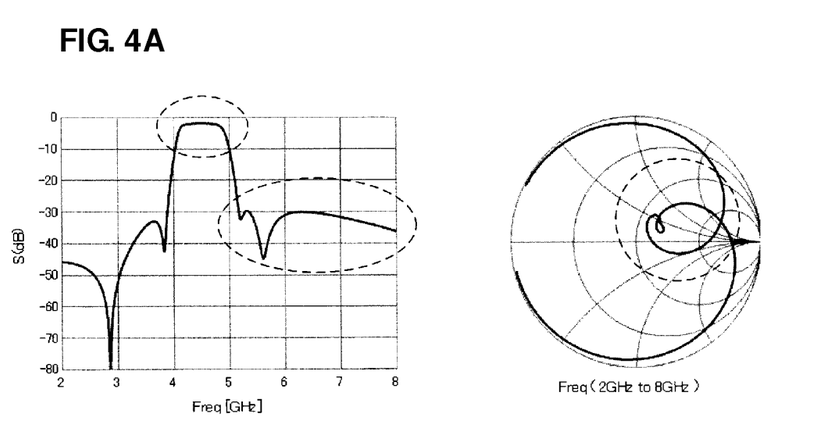
FIGS. 4A and 4B illustrate a simulation waveform of the band-pass filter according to a preferred embodiment of the present invention.
Figure 4B:
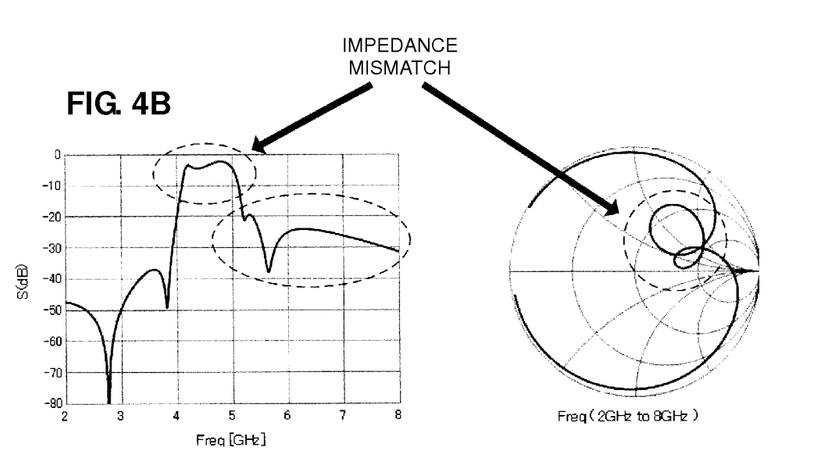

FIGS. 4A and 4B illustrate simulation waveform results of attenuation characteristics and impedance characteristics of the band-pass filter according to the first preferred embodiment. FIG. 4A illustrates a band-pass filter, described with reference to FIGS. 1 to 3, including LC parallel resonators at three stages and two trap resonators that are electromagnetically coupled to, among the LC parallel resonators at the three stages, LC parallel resonators at two ends. In contrast, FIG. 4B illustrates a band-pass filter with a configuration similar to that illustrated in FIG. 4A except that the LC parallel resonators are not electromagnetically coupled to the trap resonators.

Referring to FIG. 4B, the insertion loss in the passband is partially increased due to impedance mismatch between the input and output terminals and the LC parallel resonators. In contrast, referring to FIG. 4A, the impedance mismatch is overcome, and hence, an increase in the insertion loss in the passband is prevented. In addition, attenuation characteristics at frequencies higher than the passband are also improved, compared with those in FIG. 4B.

Second Preferred Embodiment

The first preferred embodiment discusses a non-limiting example in which the inductors of the LC parallel resonators and the trap resonators are electromagnetically coupled to each other by causing the substantially loop shaped configurations of the LC parallel resonators to partially overlap the substantially loop shaped configurations of the trap resonators. A second preferred embodiment discusses an example in which the capacitors of the LC parallel resonators and the trap resonators are electromagnetically coupled to each other via the coupling electrode layer. Description of a portion of the second preferred embodiment that is common to the first preferred embodiment will be omitted.

Figure 5A:
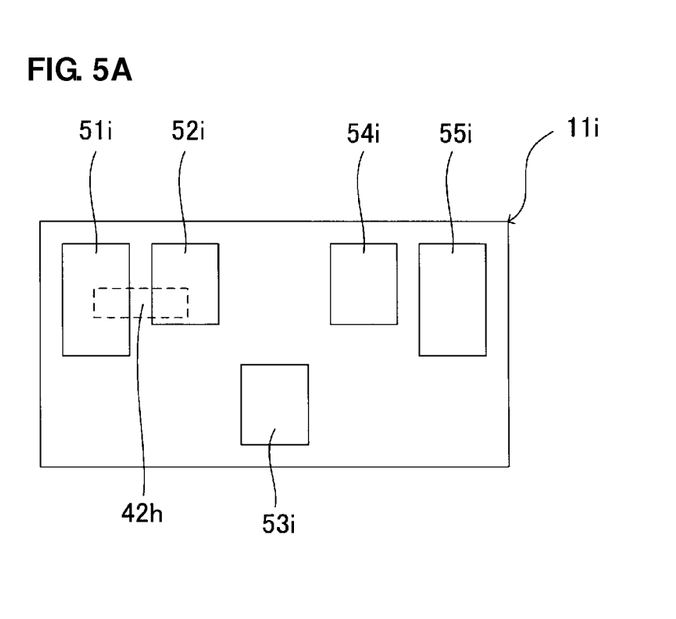
FIG. 5A is a plan view of a dielectric layer, showing the positional relationship between capacitor electrode layers and a coupling electrode layer.

FIG. 5A is a plan view of a dielectric layer, showing the positional relationship between capacitor electrode layers and a coupling electrode layer. In the second preferred embodiment, in addition to the configuration discussed in the first preferred embodiment, the coupling electrode layer 42*h* is located on the dielectric layer 11*h* (not illustrated). The connecting electrode layer 39*h* (see FIG. 3), which exists in the band-pass filter according to the first preferred embodiment, is unnecessary in the second preferred embodiment. The coupling electrode layer 42*h* faces, across the dielectric layer 11*h*, the capacitor electrode layer 51*i* of the trap resonator LC1 and the capacitor electrode layer 52*i* of the LC parallel resonator LC2, and generates capacitive coupling.

Figure 5B:
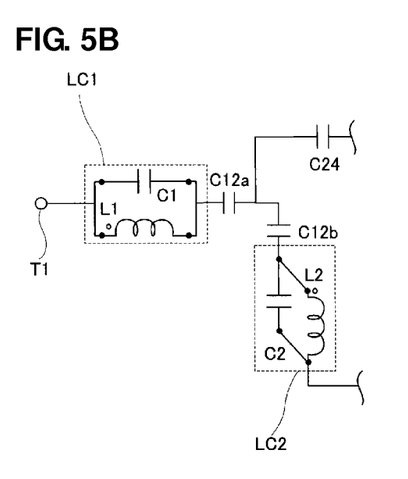
FIG. 5B is an equivalent circuit diagram of the configuration illustrated in FIG. 5A.

FIG. 5B is an equivalent circuit diagram of the configuration illustrated in FIG. 5A. FIG. 5B is different from the equivalent circuit according to the first preferred embodiment, which is illustrated in FIG. 1, in that there are a coupling capacitor C12*a* and a coupling capacitor C12*b* between the trap resonator LC1 and the LC parallel resonator LC2. The coupling capacitor C12*a* is configured by the coupling electrode layer 42*h* and the capacitor electrode layer 51*i* of the trap resonator LC1, which face each other. The coupling capacitor C12*b* is configured by the coupling electrode layer 42*h* and the capacitor electrode layer 52*i* of the LC parallel resonator LC2, which face each other. Accordingly, the impedance mismatch between the input or output terminal and the LC parallel resonator may be prevented by providing capacitors between the trap resonator and the LC parallel resonator. The sizes of the coupling capacitors C12*a* and C12*b* are adjustable by adjusting the position or size of the coupling electrode layer 42*h* illustrated in FIG. 5A.

The second preferred embodiment discusses an example in which the capacitors C12*a* and C12*b* are provided between the trap resonator LC1 on the input terminal side and the LC parallel resonator LC2. Capacitors may be provided between the trap resonator LC5 on the output terminal side and the LC parallel resonator LC4.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A band-pass filter comprising:
an input terminal;
an output terminal;
at least one LC parallel resonator arranged between the input terminal and the output terminal, the at least one LC parallel resonator including one end that is grounded;
at least one trap resonator arranged between the at least one LC parallel resonator and at least one of the input terminal and the output terminal, the at least one trap resonator being arranged to be electromagnetically coupled to the at least one LC parallel resonator;
a plurality of dielectric layers;
a plurality of electrode layers respectively located on the plurality of dielectric layers, the plurality of dielectric layers and the plurality of electrode layers being stacked on one another; wherein
an inductor of the at least one LC parallel resonator and an inductor of the at least one trap resonator each include a via electrode penetrating through the plurality of dielectric layers and a line electrode layer located on one of the plurality of dielectric layers;
a capacitor of the at least one LC parallel resonator includes a capacitor electrode layer and a ground electrode layer that face each other;
the inductor of the at least one LC parallel resonator has a substantially loop shaped configuration including the respective line electrode layer, the respective via electrode that establishes an electrical connection between one of two ends of the respective line electrode layer and the capacitor electrode layer, and a second via electrode that establishes an electrical connection between the other end of the respective line electrode layer and the ground electrode layer;
a capacitor of the at least one trap resonator includes a pair of capacitor electrode layers that face each other;
the inductor of the at least one trap resonator has a substantially loop shaped configuration including the respective line electrode layer, the respective, the via electrode that establishes an electrical connection between one of two ends of the respective line electrode layer and one of the pair of capacitor electrode layers, and a respective via electrode that establishes electrical connection between the other end of the respective line electrode layer and the one other of the pair of capacitor electrode layers;
the at least one LC parallel resonator includes a plurality of LC parallel resonators; and
the capacitor electrode layer of a first LC parallel resonator, among the plurality of LC parallel resonators, which is closest to the at least one trap resonator, and the one of the pair of capacitor electrode layers of the at least one trap resonator face a coupling electrode layer located on one of the plurality of dielectric layers, across respective dielectric layer thereof, and the first LC parallel resonator and the at least one trap resonator are electromagnetically coupled to each other via the coupling electrode layer.

2. The band-pass filter according to claim 1, wherein the plurality of LC parallel resonators includes three LC parallel resonators and the at least one trap resonator includes two trap resonators.

3. The band-pass filter according to claim 2, wherein the three LC parallel resonators are located between the two trap resonators.

4. The band-pass filter according to claim 2, further comprising a second capacitor connected to at least two of the three LC parallel resonators and the two trap resonators.

5. The band-pass filter according to claim 1, wherein
a height, in a stacking direction, of the substantially loop shaped configuration of the inductor of the first LC parallel resonator is equal or substantially equal to a height, in the stacking direction, of the substantially loop shaped configuration of the inductor of the at least one trap resonator.

6. The band-pass filter according to claim 1, wherein the substantially loop shaped configuration of the inductor of the at least one LC parallel resonator and the substantially loop shaped configuration of the inductor of the at least one trap resonator at least partially overlap, when viewed in a direction perpendicular or substantially perpendicular to a surface including the respective via electrodes of the inductor of the at least one LC parallel resonator or the at least one trap resonator.

7. The band-pass filter according to claim 1, wherein the plurality of dielectric layers and the plurality of electrode layers collectively form a substantially rectangular parallelepiped body.

8. A band-pass filter comprising:
an input terminal;
an output terminal;
at least one LC parallel resonator arranged between the input terminal and the output terminal, the at least one LC parallel resonator including one end that is grounded;
at least one trap resonator arranged between the at least one LC parallel resonator and at least one of the input terminal and the output terminal, the at least one trap resonator being arranged to be electromagnetically coupled to the at least one LC parallel resonator;
a plurality of dielectric layers;
a plurality of electrode layers respectively located on the plurality of dielectric layers, the plurality of dielectric layers and the plurality of electrode layers being stacked on one another; wherein
an inductor of the at least one LC parallel resonator and an inductor of the at least one trap resonator each include a via electrode penetrating through the plurality of dielectric layers and a line electrode layer located on one of the plurality of dielectric layers;
a capacitor of the at least one LC parallel resonator includes a capacitor electrode layer and a ground electrode layer that face each other;
the inductor of the at least one LC parallel resonator has a substantially loop shaped configuration including the respective line electrode layer, the respective via electrode that establishes an electrical connection between one of two ends of the respective line electrode layer and the capacitor electrode layer, and a second via electrode that establishes an electrical connection between the other end of the respective line electrode layer and the ground electrode layer;
a capacitor of the at least one trap resonator includes a pair of capacitor electrode layers that face each other;

the inductor of the at least one trap resonator has a substantially loop shaped configuration including the respective line electrode layer, the respective via electrode that establishes an electrical connection between one of two ends of the respective line electrode layer and one of the pair of capacitor electrode layers, and a third via electrode that establishes an electrical connection between the other end of the respective line electrode layer and the one other of the pair of capacitor electrode layers;

an adjusting electrode layer located on one of the plurality of dielectric layers and connected to the ground electrode layer; and with respect to the line electrode layer of the at least one LC parallel resonator, the adjusting electrode layer is located on an opposite side, in a stacking direction, to the ground electrode layer and the capacitor electrode layer of the capacitor of the at least one LC parallel resonator, and is arranged to overlap the line electrode layer of the at least one LC parallel resonator when viewed in the stacking direction.

9. The band-pass filter according to claim 8, wherein the at least one LC parallel resonator includes a plurality of LC parallel resonators; and the capacitor electrode layer of the at least one LC parallel resonator, among the plurality of LC parallel resonators, which is closest to the at least one trap resonator, and the capacitor electrode layer of the at least one trap resonator face a coupling electrode layer located on one of the plurality of dielectric layers, across the dielectric layer thereof, and the at least one LC parallel resonator and the at least one trap resonator are electromagnetically coupled to each other via the coupling electrode layer.

10. The band-pass filter according to claim 8, wherein the substantially loop shaped configuration of the inductor of the at least one LC parallel resonator and the substantially loop shaped configuration of the inductor of the at least one trap resonator at least partially overlap, when viewed in a direction perpendicular or substantially perpendicular to a surface including the respective via electrodes of the inductor of the at least one LC parallel resonator or the at least one trap resonator.

11. The band-pass filter according to claim 8, wherein the at least one LC parallel resonator includes a plurality of LC parallel resonators; and a height, in a stacking direction, of the substantially loop shaped configuration of the inductor of a first LC parallel resonator, among the plurality of LC parallel resonators, which is closest to the at least one trap resonator, is equal or substantially equal to a height, in the stacking direction, of the substantially loop shaped configuration of the inductor of the at least one trap resonator.

12. The band-pass filter according to claim 8, wherein the plurality of dielectric layers and the plurality of electrode layers collectively form a substantially rectangular parallelepiped body.

13. The band-pass filter according to claim 8, wherein the at least one LC parallel resonator includes three LC parallel resonators and the at least one trap resonator includes two trap resonators.

14. The band-pass filter according to claim 13, wherein the three LC parallel resonators are located between the two trap resonators.

15. The band-pass filter according to claim 13, further comprising a capacitor connected to at least two of the three LC parallel resonators and the two trap resonators.

* * * * *